Figure 1:
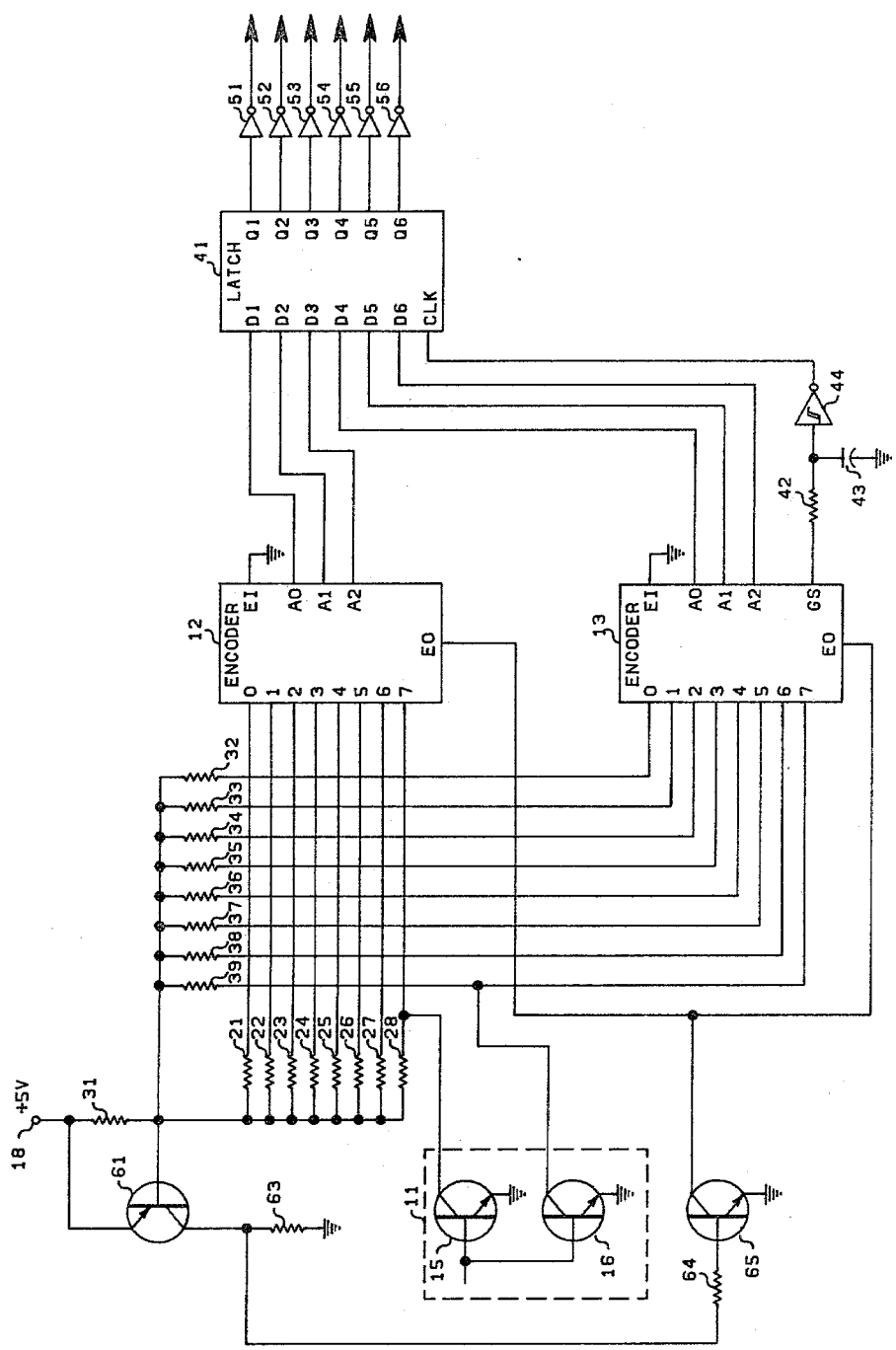

United States Patent [19]

Lacy

[11] 4,293,849
[45] Oct. 6, 1981

[54] KEYBOARD ENCODER USING PRIORITY ENCODERS

[75] Inventor: Robert H. Lacy, Bartlesville, Okla.

[73] Assignee: Phillips Petroleum Company, Bartlesville, Okla.

[21] Appl. No.: 41,590

[22] Filed: May 23, 1979

[51] Int. Cl.³ .............................................. G06F 3/02
[52] U.S. Cl. ............................. 340/365 S; 340/365 E
[58] Field of Search ............ 340/365 R, 365 S, 365 E, 340/365 L, 166 R, 168 R, 168 B; 178/17 C; 179/90 K; 338/32 H; 323/94 H; 307/247 A; 84/1.01; 400/479, 472, 479.2

[56] References Cited

U.S. PATENT DOCUMENTS

| | | | |
|---|---|---|---|
| 3,493,928 | 2/1970 | Juliusburger | 340/365 S |
| 3,551,616 | 12/1970 | Juliusburger et al. | 340/365 S |
| 3,611,358 | 10/1971 | Dalmasso | 340/365 L |
| 3,623,082 | 11/1971 | Stein et al. | 340/365 S |
| 3,781,874 | 12/1973 | Jennings | 340/365 S |
| 3,928,789 | 12/1975 | Elias | 340/365 S |
| 3,949,365 | 4/1976 | Kashio | 340/365 S |
| 3,978,474 | 8/1976 | Engstrom | 340/365 E |
| 4,072,820 | 2/1978 | Gunther | 178/17 C |
| 4,101,871 | 7/1978 | Oliveira | 340/365 S |
| 4,138,917 | 2/1979 | Sakashita et al. | 340/365 S |

OTHER PUBLICATIONS

*Control Engineering*, Feb. 1977, pp. 41, 42.

*Primary Examiner*—James J. Groody

[57] ABSTRACT

An electrical circuit is provided for converting the output from a keyboard into a binary form. At least two priority encoders are interfaced to the keyboard. Each priority encoder generates a binary code when a particular key is depressed. The individual binary outputs from the priority encoders are combined to provide a binary output which is representative of the particular key which has been depressed. In this manner, the output of the keyboard is encoded to binary form. The keyboard encoding system is disabled when a plurality of switches are simultaneously closed to thereby prevent errors caused by multiple switch closures.

8 Claims, 1 Drawing Figure

KEYBOARD ENCODER USING PRIORITY ENCODERS

This invention relates to keyboard encoding. In a particular aspect this invention relates to method and apparatus for converting the output of a keyboard into a binary form. In another particular aspect this invention relates to method and apparatus for encoding the output of Hall effect type-switches. In another particular aspect this invention relates to method and apparatus for preventing errors caused by the depressing of multiple switches simultaneously in a keyboard encoding system.

A keyboard is the primary means of communication between the human world and the machine world of computers. Commands, data or other types of information are generally transmitted from a human to a computer simply by means of pressing particular switches on a keyboard. However, the alpha-numeric symbols of the keyboard must be translated or encoded to the binary language of the computer before the output from the keyboard can be utilized by the computer. Many translators or encoders are available and the solutions to the problem of interfacing a keyboard and a computer are many and varied.

A typical encoder utilizes logic circuits to define and provide a unique address to a memory such as a read-only memory. The read-only memory is programmed in such a manner that when the unique address is received by the read only memory, the read-only memory provides a unique binary output in response to the address. This binary output is provided to a computer bus when the address is received by the memory and in this manner the keyboard is effectively interfaced to the computer. Such interfaces generally rely on what are referred to in the art as "contact closure" switches. When a contact closure switch is depressed, two lines in the logic circuit are generally electrically connected through the contact closure switch. The particular two lines connected define the particular address which is to be provided to the memory or other similar device.

Hall effect type switches have been developed which do not rely on a contact closure to connect two signal lines. These types of switches either act as a current source or a current sink for two signal lines. The fact that no physical contact is required by the Hall effect type switches enhances the life and reliability of the keyboard itself by virtue of the fact that there is no contact erosion or bounce. It is thus desirable to use Hall effect type switches in keyboard systems. However, it has been difficult in the past to interface a keyboard, using Hall effect type switches, to a computer. It is thus an object of this invention to provide method and apparatus for encoding the output of Hall effect type switches. It is a particular object of this invention to provide a simple, electronic interface between a keyboard using Hall effect type switches and a device, such as a computer, which requires a binary input.

In keyboard encoding systems, the simultaneous closure of two or more switches may result in an output code which does not correspond to any of the closed switches. This adverse condition may result in errors in the information being transmitted to a device such as a computer. It is thus another object of this invention to provide method and apparatus for preventing errors caused by the depressing of multiple switches simultaneously in a keyboard encoding system.

In accordance with the present invention, method and apparatus is provided whereby the input to two priority encoders are tied through pull-up resistors to a positive voltage supply. Each of the switches on the keyboard is tied to one of the input lines to each of the two priority encoders. When a particular switch is depressed, the two lines to which the particular switch is electrically connected will be pulled to ground. Each of the priority encoders will provide a binary output which corresponds to the particular input line which was pulled to ground. The binary output from each of the priority encoders are combined to provide a single binary code which is representative of the particular switch on the keyboard which has been depressed. This binary code is then provided through a latch and a buffer to a device such as a computer.

In order to prevent multiple switch closures from causing errors in the information provided to the computer, an electrical circuit is provided whereby the encoding system is disabled when a plurality of switches are simultaneously closed. The closure of a single switch will cause two input lines to the priority encoders to be pulled to ground. The closure of at least two switches simultaneously will result in at least three input lines to the priority encoders being pulled to ground. The multiple key switch closures detection circuit is configured in such a manner that a transistor is turned on when more than two input lines are grounded. The transistor is not turned on when only two input lines are grounded. When the transistor turns on, a voltage is provided which effectively disables the keyboard encoding system.

Other objects and advantages of the invention will be apparent from foregoing brief description of the invention and the claims together with the detailed description of the drawing which is briefly described as follows:

FIG. 1 is a schematic diagram of the keyboard encoding circuit of the present invention.

The invention is described in terms of a particular electronic circuit which employs particular components. The invention is, however, applicable to different circuit configurations and is also applicable to circuits which employ different electrical components which accomplish the purpose of the electrical components set forth in the preferred embodiment of the present invention.

The invention is also described in terms of a encoding system which can handle a keyboard having at least 64 switches. This number could be reduced or increased as desired. The invention is also described in terms of Hall effect type switches which ground (act as current sinks for) particular signal lines. However, the invention is also applicable to Hall effect type switches which act as current sources for signal lines.

Referring now to the drawing, the output stage 11 of a Hall effect type switch which is preferably a Model 101SM15, manufactured by Microswitch, is illustrated connected to the most significant bit input (7) of both priority encoder 12 and priority encoder 13. Only one switch is illustrated in FIG. 1 for the sake of simplicity. The circuit illustrated in FIG. 1 is capable of handling 64 switches. Each of the 64 switches would be connected to one input line of the encoder 12 and one input line of the encoder 13. The output stage 11 of the switch consists of two NPN transistors 15 and 16. Closure of the switch turns on transistors 15 and 16 which effectively grounds the most significant bit inputs of the encoders 12 and 13.

The least significant bit input (0) through the most significant bit input (7) of the priority encoder 12 are tied to the +5 volt power supply 18 through resistors 21-28, respectively, which are each in series with resistor 31. In like manner, the least significant bit input (0) through the most significant bit input (7) of the priority encoder 13 are tied through resistors 32-39, respectively, which are each in series with resistor 31. The enable inputs (EI) of the priority encoders 12 and 13 are tied to ground. The A0-A2 outputs of the priority encoder 12 are tied to the D1-D3 inputs of the data latch 41. The A0-A2 outputs from the priority encoder 13 are tied to the D4-D6 inputs, respectively, of the data latch 41. The group select output of the priority encoder 13 is tied to the combination of resistor 42 and capacitor 43 as an input to the Schmitt trigger 44. The output of the Schmitt trigger 44 is supplied to the clock input of the data latch 41. The Q1-Q6 outputs of the data latch 41 are tied through inverters 51-56, respectively, to a device such as a computer (not illustrated). The inverters 51-56 act as buffers for the output signals from the data latch 41.

The emitter of the transistor 61 is tied to the +5 volt power supply 18. The base of the transistor 61 is tied to the +5 volt power supply 18 through resistor 31. The collector of the transistor 61 is tied to ground through resistor 63. The collector of the transistor 61 is also tied through resistor 64 to the base of transistor 65. The emitter of transistor 65 is tied to ground. The collector of transistor 65 is tied to the enable output (EO) of the priority encoder 12 and the priority encoder 13.

In operation, a particular switch, which is represented by the switch 11, is closed. The closure of the switch turns on transistors 15 and 16 which has the effect of grounding the most significant bit input of the priority encoder 12 and the most significant bit input of the priority encoder 13. The A0-A2 outputs from the priority encoder 12 will be representative of a binary 7 because the most significant bit input of the priority encoder 12 is grounded. In like manner, the A0-A2 outputs from the priority encoder 13 will be representative of a binary 7 because the most significant bit input of the priority encoder 13 is grounded. Thus, the output from the data latch 41 will be representative of the combination of the three bit binary code from the encoder 12 and the three bit binary code from the encoder 13. The output lines from the data latch 41 will be representative of 111111 when the data latch 41 is enabled to transfer the data on the D1-D6 inputs to the Q1-Q6 outputs of the data latch 41.

A clock signal is provided to the data latch 41 from the group select (GS) output of the encoder 13. The GS output of the encoder 13 is delayed approximately 100 nanoseconds at the Schmitt trigger 44. The positive going edge of the output from the Schmitt trigger 44 latches the encoder output in the data latch 41.

As has been previously stated, the switch 11 could be tied to any one of the input lines of the encoder 12 and any one of the input lines of the encoder 13. A possible combination for 64 switches is illustrated in Table I.

TABLE I

FUNCTIONAL KEYBOARD SWITCH CODES

| Switch No. | Priority Encoder 12 Input | | | | | | | | Priority Encoder 13 Input | | | | | | | | Output Code | | | | | |
|---|---|---|---|---|---|---|---|---|---|---|---|---|---|---|---|---|---|---|---|---|---|---|
| | 7 | 6 | 5 | 4 | 3 | 2 | 1 | 0 | 7 | 6 | 5 | 4 | 3 | 2 | 1 | 0 | | | | | | |
| 0 | | | | | | | | X | | | | | | | | X | 0 | 0 | 0 | 0 | 0 | 0 |
| 1 | | | | | | | | X | | | | | | | X | | 0 | 0 | 0 | 0 | 0 | 1 |
| 2 | | | | | | | | X | | | | | | X | | | 0 | 0 | 0 | 0 | 1 | 0 |
| 3 | | | | | | | | X | | | | | X | | | | 0 | 0 | 0 | 0 | 1 | 1 |
| 4 | | | | | | | | X | | | | X | | | | | 0 | 0 | 0 | 1 | 0 | 0 |
| 5 | | | | | | | | X | | | X | | | | | | 0 | 0 | 0 | 1 | 0 | 1 |
| 6 | | | | | | | | X | | X | | | | | | | 0 | 0 | 0 | 1 | 1 | 0 |
| 7 | | | | | | | | X | X | | | | | | | | 0 | 0 | 0 | 1 | 1 | 1 |
| 8 | | | | | | | X | | | | | | | | | X | 0 | 0 | 1 | 0 | 0 | 0 |
| 9 | | | | | | | X | | | | | | | | X | | 0 | 0 | 1 | 0 | 0 | 1 |
| 10 | | | | | | | X | | | | | | | X | | | 0 | 0 | 1 | 0 | 1 | 0 |
| 11 | | | | | | | X | | | | | | X | | | | 0 | 0 | 1 | 0 | 1 | 1 |
| 12 | | | | | | | X | | | | | X | | | | | 0 | 0 | 1 | 1 | 0 | 0 |
| 13 | | | | | | | X | | | | X | | | | | | 0 | 0 | 1 | 1 | 0 | 1 |
| 14 | | | | | | | X | | | X | | | | | | | 0 | 0 | 1 | 1 | 1 | 0 |
| 15 | | | | | | | X | | X | | | | | | | | 0 | 0 | 1 | 1 | 1 | 1 |
| 16 | | | | | | X | | | | | | | | | | X | 0 | 1 | 0 | 0 | 0 | 0 |
| 17 | | | | | | X | | | | | | | | | X | | 0 | 1 | 0 | 0 | 0 | 1 |
| 18 | | | | | | X | | | | | | | | X | | | 0 | 1 | 0 | 0 | 1 | 0 |
| 19 | | | | | | X | | | | | | | X | | | | 0 | 1 | 0 | 0 | 1 | 1 |
| 20 | | | | | | X | | | | | | X | | | | | 0 | 1 | 0 | 1 | 0 | 0 |
| 21 | | | | | | X | | | | | X | | | | | | 0 | 1 | 0 | 1 | 0 | 1 |
| 22 | | | | | | X | | | | X | | | | | | | 0 | 1 | 0 | 1 | 1 | 0 |
| 23 | | | | | | X | | | X | | | | | | | | 0 | 1 | 0 | 1 | 1 | 1 |
| 24 | | | | | X | | | | | | | | | | | X | 0 | 1 | 1 | 0 | 0 | 0 |
| 25 | | | | | X | | | | | | | | | | X | | 0 | 1 | 1 | 0 | 0 | 1 |
| 26 | | | | | X | | | | | | | | | X | | | 0 | 1 | 1 | 0 | 1 | 0 |
| 27 | | | | | X | | | | | | | | X | | | | 0 | 1 | 1 | 0 | 1 | 1 |
| 28 | | | | | X | | | | | | | X | | | | | 0 | 1 | 1 | 1 | 0 | 0 |
| 29 | | | | | X | | | | | | X | | | | | | 0 | 1 | 1 | 1 | 0 | 1 |
| 30 | | | | | X | | | | | X | | | | | | | 0 | 1 | 1 | 1 | 1 | 0 |
| 31 | | | | | X | | | | X | | | | | | | | 0 | 1 | 1 | 1 | 1 | 1 |
| 32 | | | | X | | | | | | | | | | | | X | 1 | 0 | 0 | 0 | 0 | 0 |
| 33 | | | | X | | | | | | | | | | | X | | 1 | 0 | 0 | 0 | 0 | 1 |
| 34 | | | | X | | | | | | | | | | X | | | 1 | 0 | 0 | 0 | 1 | 0 |
| 35 | | | | X | | | | | | | | | X | | | | 1 | 0 | 0 | 0 | 1 | 1 |
| 36 | | | | X | | | | | | | | X | | | | | 1 | 0 | 0 | 1 | 0 | 0 |
| 37 | | | | X | | | | | | | X | | | | | | 1 | 0 | 0 | 1 | 0 | 1 |
| 38 | | | | X | | | | | | X | | | | | | | 1 | 0 | 0 | 1 | 1 | 0 |
| 39 | | | | X | | | | | X | | | | | | | | 1 | 0 | 0 | 1 | 1 | 1 |

TABLE I-continued

FUNCTIONAL KEYBOARD SWITCH CODES

| Switch No. | Priority Encoder 12 Input | | | | | | | | Priority Encoder 13 Input | | | | | | | | Output Code | | | | | |
|---|---|---|---|---|---|---|---|---|---|---|---|---|---|---|---|---|---|---|---|---|---|---|
| | 7 | 6 | 5 | 4 | 3 | 2 | 1 | 0 | 7 | 6 | 5 | 4 | 3 | 2 | 1 | 0 | | | | | | |
| 40 | | | X | | | | | | | | | | | | | X | 1 | 0 | 1 | 0 | 0 | 0 |
| 41 | | | X | | | | | | | | | | | | X | | 1 | 0 | 1 | 0 | 0 | 1 |
| 42 | | | X | | | | | | | | | | | X | | | 1 | 0 | 1 | 0 | 1 | 0 |
| 43 | | | X | | | | | | | | | | X | | | | 1 | 0 | 1 | 0 | 1 | 1 |
| 44 | | | X | | | | | | | | | X | | | | | 1 | 0 | 1 | 1 | 0 | 0 |
| 45 | | | X | | | | | | | | X | | | | | | 1 | 0 | 1 | 1 | 0 | 1 |
| 46 | | | X | | | | | | | X | | | | | | | 1 | 0 | 1 | 1 | 1 | 0 |
| 47 | | | X | | | | | | X | | | | | | | | 1 | 0 | 1 | 1 | 1 | 1 |
| 48 | | X | | | | | | | | | | | | | | X | 1 | 1 | 0 | 0 | 0 | 0 |
| 49 | | X | | | | | | | | | | | | | X | | 1 | 1 | 0 | 0 | 0 | 1 |
| 50 | | X | | | | | | | | | | | | X | | | 1 | 1 | 0 | 0 | 1 | 0 |
| 51 | | X | | | | | | | | | | | X | | | | 1 | 1 | 0 | 0 | 1 | 1 |
| 52 | | X | | | | | | | | | | X | | | | | 1 | 1 | 0 | 1 | 0 | 0 |
| 53 | | X | | | | | | | | | X | | | | | | 1 | 1 | 0 | 1 | 0 | 1 |
| 54 | | X | | | | | | | | X | | | | | | | 1 | 1 | 0 | 1 | 1 | 0 |
| 55 | | X | | | | | | | X | | | | | | | | 1 | 1 | 0 | 1 | 1 | 1 |
| 56 | X | | | | | | | | | | | | | | | X | 1 | 1 | 1 | 0 | 0 | 0 |
| 57 | X | | | | | | | | | | | | | | X | | 1 | 1 | 1 | 0 | 0 | 1 |
| 58 | X | | | | | | | | | | | | | X | | | 1 | 1 | 1 | 0 | 1 | 0 |
| 59 | X | | | | | | | | | | | | X | | | | 1 | 1 | 1 | 0 | 1 | 1 |
| 60 | X | | | | | | | | | | | X | | | | | 1 | 1 | 1 | 1 | 0 | 0 |
| 61 | X | | | | | | | | | | X | | | | | | 1 | 1 | 1 | 1 | 0 | 1 |
| 62 | X | | | | | | | | | X | | | | | | | 1 | 1 | 1 | 1 | 1 | 0 |
| 63 | X | | | | | | | | X | | | | | | | | 1 | 1 | 1 | 1 | 1 | 1 |

Referring to Table I, Switch No. 0 would be tied to the least significant bit input (0) of the priority of encoder 12 and would also be tied to the least significant bit input (0) of the priority encoder 13. The output code from the data latch 41 would be 000000. Table I thus sets forth a possible electrical connection for each of 64 switches and gives the corresponding output code which is derived from the closure of a particular switch configured in the manner set forth in Table I.

A multi-switch closure detection circuit is provided by transistors 61 and 65 together with resistors 31, 63 and 64. As has been previously stated, the closure of a single key switch will cause two input lines to be grounded. The closure of at least two key switches will result in at least three input lines being grounded as is illustrated in Table I. The resistor 31 is selected such that three grounded input lines will develop sufficient voltage across resistor 31 to turn on transistor 61 while only two grounded input lines will not result in sufficient voltage being generated across resistor 31 to turn on the transistor 61. In the preferred embodiment of the present invention, resistor 31 is preferably 52 ohms. However, other resistance values could be utilized if desired so long as the particular resistance value chosen allows the differentiation between the grounding of two input lines and the grounding of at least three input lines.

Transistors 61 and 65 preferably have a minimum $h_{fe}$ specification of 250. The high $h_{fe}$ results in a sharp knee on the $V_{BE}$ versus $I_C$ curve. This results in a sharply defined on/off threshold for transistors 61 and 65. This is desirable for the distinction between the grounding of two input lines and the grounding of three input lines is required to detect the closure of multiple switches.

When more than one switch is closed simultaneously, both transistor 61 and transistor 65 are turned on. This results in the enable output of the priority encoder 12 and the enable output of the priority encoder 13 being clamped to ground. Grounding of the enable output of the priority encoder 13 will disable the group select output from the priority encoder 13. The output from the priority encoders 12 and 13 will thus not be latched into the data latch 41 and the keyboard encoding circuit will be effectively disabled by the simultaneous closure of more than one switch. In this manner, errors due to the closure of more than one switch at substantially the same time are prevented.

The invention has been described in terms of its presently preferred embodiment as is illustrated in FIG. 1. For the sake of convenience, signals which supply power to the various chips illustrated have been omitted. Voltage levels required by the various chips are specified by the manufacturer and are well known to those familiar with the art.

Many different circuit configurations are possible which would perform the functions required of the circuit illustrated in FIG. 1. FIG. 1 is illustrative of a particular circuit configuration which will perform the required functions.

Specific components which are available commercially and which can be used in the practice of the invention as illustrated in FIG. 1 follow. Values of resistors and capacitors used in these particular circuits are also given. Again, many different combinations of circuit values, particularly in the areas of resistance and capacitance values, are possible.

| | |
|---|---|
| Hall effect switch 11 | 101SN15 |
| | Micro Switch, Div. Honeywell |
| Priority Encoders 12 and 13 | 93L18 |
| | Fairchild Semiconductor |
| Data latch 41 | 74LS174 |
| | National Semiconductor |
| Inverters 51–56 | 74LS366 |
| | National Semiconductor |
| Schmitt trigger 44 | 7414 |
| | National Semiconductor |
| Capacitor 43 | 330 Picofarads, CKR05BX331KL |
| | Sprague |
| Transistor 65 | 2N5089 |
| | Motorola Semiconductor |
| Transistor 61 | 2N5087 |
| | Motorola Semiconductor |
| Resistor 31, 42 | 52 ohms, RLR-05 |
| | Dale Electronics |
| Resistors 21–28 and 32–39 | 1 Kohms, RN55D |
| | Dale Electronics |
| Resistor 63 | 10 Kohms, RN55D |
| | Dale Electronics |
| Resistor 64 | 120 ohms, RN55D |

While the invention has been described in terms of the presently preferred embodiment, reasonable variations and modifications are possible by those skilled in the art, within the scope of the described invention and the appended claims.

That which is claimed is:

1. A keyboard encoder comprising:
   a plurality of switching means, each of said plurality of switching means having at least two outputs;
   a first priority encoder having a plurality of data inputs and a plurality of data outputs;
   a second priority encoder having a plurality of data inputs and a plurality of data outputs;
   a voltage supply;
   means for electrically connecting the data inputs of said first priority encoder to said voltage supply;
   means for electrically connecting the data inputs of said second priority encoder to said voltage supply;
   means for connecting a first one of the outputs from each of said plurality of switching means to a respective one of the data inputs of said first priority encoder;
   means for electrically connecting a second one of the outputs from each of said plurality of switching means to a respective one of the data inputs of said second priority encoder;
   means for combining the data outputs of said first priority encoder with the data outputs of said second priority encoder to form a combined binary output, the closure of one of said plurality of switching means enabling said first priority encoder to provide a binary output representative of the particular data input of said first priority encoder which is electrically connected to said one of said plurality of switching means which is closed and enabling said second priority encoder to provide a binary output which is representative of the particular data input of said second priority encoder which is electrically connected to said one of said plurality of switching means which is closed, said combined binary output being representative of the one of said plurality of switching means which is closed.

2. Apparatus in accordance with claim 1 wherein each of said plurality of switching means is a Hall effect switching means.

3. Apparatus in accordance with claim 2 wherein said first priority encoder and said second priority encoder each have eight data inputs and each have three data outputs and wherein said first priority encoder and said second priority encoder each have an enabling output.

4. Apparatus in accordance with claim 3 wherein the particular data input of said first priority encoder which is connected to the one of said plurality of switching means which is closed and the particular data input of said second priority encoder which is connected to the one of said plurality of switching means which is closed are both pulled to ground.

5. Apparatus in accordance with claim 4 wherein said means for electrically connecting the data inputs of said first priority encoder to said voltage supply and said means for electrically connecting the data inputs of said second priority encoder to said voltage supply comprise pull-up resistors.

6. Apparatus in accordance with claim 5 wherein said means for combining the data outputs of said first priority encoder with the data outputs of said second priority encoder comprises a data latch.

7. Apparatus in accordance with claim 6 additionally comprising:
   means for disabling said keyboard encoder if more than one of said plurality of switching means is depressed substantially simultaneously.

8. Apparatus in accordance with claim 7 wherein said means for disabling said keyboard encoder comprises:
   a sense resistor electrically connected in series between said voltage supply and said means for electrically connecting the data inputs of said first priority encoder and the data inputs of said second priority encoder to said voltage supply;
   a first transistor means having a base, emitter and collector;
   means for electrically connecting the emitter of said first transistor means to said voltage supply;
   means for electrically connecting the base of said first transistor means to said voltage supply through said sense resistor;
   a first resistor;
   means for electrically connecting the collector of said first transistor means to ground through said first resistor;
   a second resistor;
   a second transistor means having a base, emitter and collector;
   means for electrically connecting the collector of said first transistor means through said second resistor to the base of said second transistor means;
   means for grounding the emitter of said second transistor means;
   means for electrically connecting the collector of said second transistor means to the enabling output of said first priority encoder and said second priority encoder, the value of said sense resistor being selected in such a manner that if more than two of the data inputs of said first priority encoder or said second priority encoder are grounded, said first transistor means and said second transistor means will be turned on to thereby disable said data latch.

* * * * *